United States Patent [19]
Yamazaki et al.

[11] Patent Number: 4,812,415

[45] Date of Patent: * Mar. 14, 1989

[54] METHOD FOR MAKING SEMICONDUCTOR DEVICE FREE FROM ELECTRICAL SHORT CIRCUITS THROUGH A SEMICONDUCTOR LAYER

[75] Inventors: Shunpei Yamazaki, Tokyo; Kunio Suzuki; Mikio Kinka, both of Atsugi; Takeshi Fukada, Ebina; Masayoshi Abe, Tokyo; Ippei Kobayashi, Atsugi; Katsuhiko Shibata, Atsugi; Masato Susukida, Atsugi; Susumu Nagayama, Tokyo; Kaoru Koyanagi, Saku, all of Japan

[73] Assignee: Semiconductor Energy Laboratory Co., Ltd., Japan

[*] Notice: The portion of the term of this patent subsequent to Nov. 22, 2005 has been disclaimed.

[21] Appl. No.: 82,115

[22] Filed: Aug. 6, 1987

Related U.S. Application Data

[62] Division of Ser. No. 909,202, Sep. 19, 1986.

[30] Foreign Application Priority Data

Sep. 21, 1985 [JP] Japan .................................. 60-209595
Sep. 21, 1985 [JP] Japan .................................. 60-209296
Nov. 6, 1985 [JP] Japan .................................. 60-248640

[51] Int. Cl.[4] ............................................. H01L 31/18
[52] U.S. Cl. ..................................... 437/2; 437/4; 437/170; 437/923; 437/939; 136/244; 136/258; 136/290
[58] Field of Search .................... 437/2, 4, 8, 51, 170, 437/173, 229, 243, 923, 928, 939, 943; 136/244, 258 AM, 290

[56] References Cited

FOREIGN PATENT DOCUMENTS 60746 1/1967 Australia .
81566 9/1982 Australia .
58-77263 5/1983 Japan .......................... 136/258 AM

*Primary Examiner*—Aaron Weisstuch
*Attorney, Agent, or Firm*—Gerald J. Ferguson, Jr.

[57] ABSTRACT

An improved semiconductor device is disclosed which is free from current leakage due to pin-holes or other gaps. Also an improved method for processing a semiconductor device is shown. According to the invention, gaps produced during the fabricating process of the semiconductor layer are filled with insulator in advance of deposition of electrodes. By virtue of this configuration, short current paths do not result when electrodes are provided on the semiconductor layer.

6 Claims, 7 Drawing Sheets

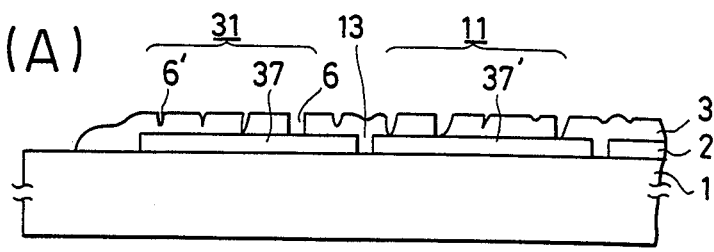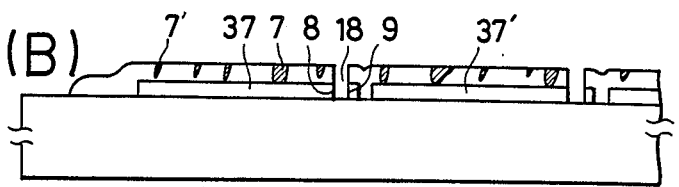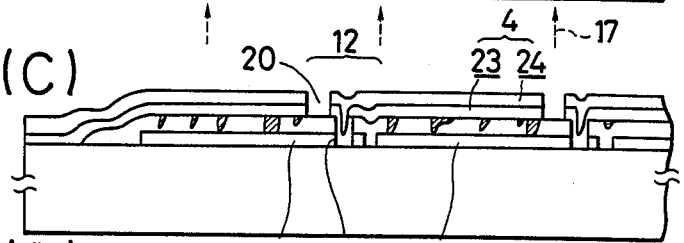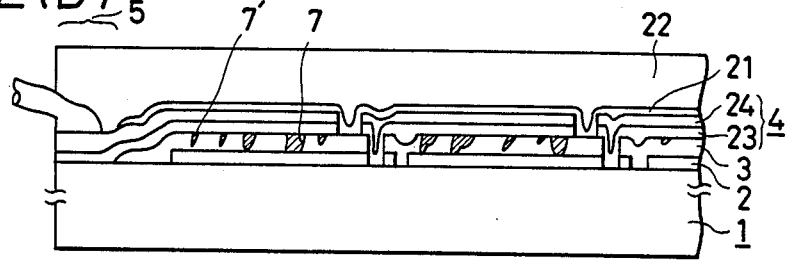

METHOD FOR MAKING SEMICONDUCTOR DEVICE FREE FROM ELECTRICAL SHORT CIRCUITS THROUGH A SEMICONDUCTOR LAYER

This is a divisional application of Ser. No. 909,202, filed Sept. 19, 1986.

BACKGROUND OF THE INVENTION

This invention relates to a semiconductor device and a method for manufacturing same in which the performance of the semiconductor device is improved. More particularly, this invention relates to measures for eliminating disadvantages caused by the effect of electrical shorts and shunts due to pinholes or other gaps created during the fabrication process of the device.

Recently, considerable efforts have been made to develop systems for depositing amorphous semiconductor alloys, each of which can encompass relatively large areas, and which can be doped to form p-type and n-type materials for the production of p-i-n and other type devices which are, in photovoltaic and other applications, substantially equivalent to their crystalline counterparts. As such devices, the applicant disclosed improved photoelectric cells in Japanese Patent Published Applications Nos. sho 55-4494, 55-124274, 56-13777, 56-13778 and 56-13779.

One example of a prior art photovoltaic device is shown in FIG. 1. In the figure, a segmented transparent conductive film 2 is formed on a glass substrate 1 with the aid of a mask aligned above the substrate 1. Semiconductor layers 3 are deposited on the substrate 1 with the conductive film segments 2 therebetween with a mask aligned above the substrate 1. Further, on the substrate 1 with the conductive film 2 and the semiconductor layers 3, aluminum layers 4 are formed as second electrodes with the aid of a mask. Reference numerals 31 and 11 designate respective photoelectric cells in the figure. Irradiation 10 is shown as from the substrate 1 side.

The two cells 31 and 11 are connected in series by means of a connection 12. In the connection 12 the second electrode 38 of cell 11 is made in contact with the first electrode 37 of cell 31. Upper electrode 39 is connected to external connection 5. Although the figure appears only with two connections, a number of the cells are connected with each other in series. Such an integrated photovoltaic device tends to be degraded after thermal treatment at 150° C. for tens of hours. Such a device is not suitable for outdoor use where the device is likely subjected to high temperature ambience.

To eliminate the adverse reaction, use is made of a double-layered electrode as the second electrode, composed of a conductive transparent layer such as an ITO film below the aluminum electrode, the ITO film being free from reaction with the aluminum layer or the semiconductor layer. The conductive transparent electrode, however, tends to be finely deposited throughout the semiconductor, including pinholes, gaps, or the like defects formed therein during fabrication processing. The transparent electrode material in the defects constitutes short current paths either as formed or due to some influence occurring after fabrication. Because of this, only photovoltaic devices having a small converting area such as of 1 cm×4 cm are currently available.

One attempt to eliminate short current circuit paths within amorphous semiconductor photovoltaic devices involves the application of a reverse bias to the device. The applied reverse bias causes large currents to flow through the short circuit current paths, thereby causing localized heating of the current paths. The localized heating crystallizes the amorphous semiconductor in the region of the short circuit current paths to increase the resistivity of the paths. Unfortunately, this process has many limitations. The resistivity of the path remains less than the resistivity of the unheated amorphous semiconductor device area although it is certainly increased by the concentrated current. As a result, the short circuit current paths are not eliminated, but have their resistivity changed to a limited extent. Also this method is not effective for eliminating short circuit current paths resulting from substrate surface irregularities which can be a most prevalent cause of short circuit current paths, especially in large area devices having a roughened substrate surface forming a diffuse back reflector.

SUMMARY OF THE INVENTION

It is therefore an object of the invention to provide an improved semiconductor device and a method for fabricating same in which adverse short circuits are effectively eliminated.

It is another object of the invention to provide an improved semiconductor device and a method for fabricating same in which undesirable shunts are eliminated with only simple procedures.

It is a further object of the invention to provide an improved semiconductor device which can be designed with an roughened, large effective area without causing short circuit current paths.

BRIEF DESCRIPTION OF THE DRAWINGS

FIGS. 2(A) through 2(D) are fragmentary, cross-sectional views showing the manufacturing process of an embodiment of the invention.

DETAILED DESCRIPTION OF THE PREFERRED EMBODIMENTS

Figure 1:
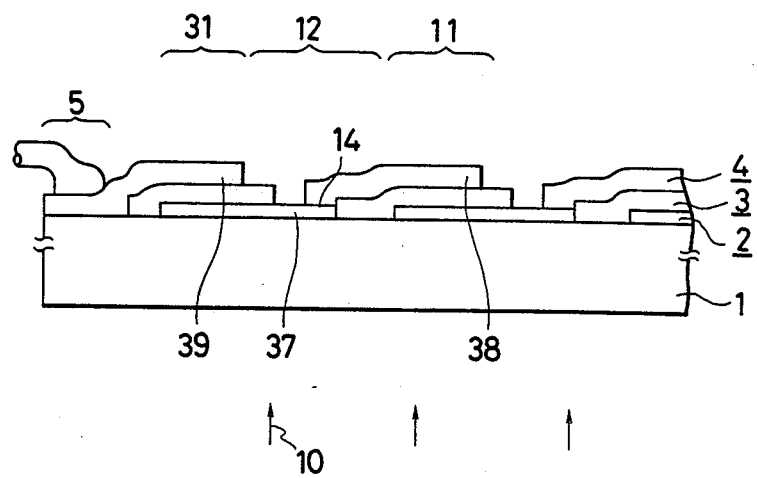
FIG. 1 is a fragmentary, cross-sectional view of a prior art solar cell.

Referring to FIGS. 2(A) through 2(D), an embodiment of the invention is shown.

In the figure, a transparent electrode 2 is formed and patterned on transparent substrate 1 made of, for example, a glass pane 1.2 mm thick×10 cm long×10 cm wide. The transparent electrode 2 is made, inter alia, from an ITO layer 1500 angstroms thick superimposed by a $SnO_2$ layer 200 to 400 angstroms thick, an ITO layer 1500 angstroms thick superimposed with a $Sn_3N_4$ layer 500 angstroms thick, or a transparent layer doped with halogen of 1500 through 2000 angstroms thickness mainly made of tin oxide or tin nitride by a CVD method in vacuum, an LPCVD method, a spraying method, or a sputtering method.

The layers thus laminated are irradiated from the upper or lower side of the substrate 1 with a laser beam of 1.06 micrometers wavelength or 0.53 micrometer wavelength from a YAG laser to perform the patterning of the transparent electrode 2. The grooves 13 of 10 cm length and 50 micrometers width formed by the patterning partition adjacent cells, each cell having 10 to 20 mm width. On the layer 2 is formed, by a plasma or photo CVD method, a non-single-crystal layer 3 of 0.2 to 1.0 micrometer thickness having a p-n or p-i-n junction, normally of 0.5 to 0.7 micrometer thickness. For instance, the non-single-crystal layer can be comprised, with a p-i-n junction, of a p-type semiconductor layer ($Si_xC_{1-x}$; where $1>x>0$) 50 to 150 angstroms thick, an intrinsic amorphous or intrinsic semiamorphous silicon semiconductor layer 0.4 to 0.9 micrometer thick, and a crystalline semiconductor layer 200 to 500 angstroms thick.

In the semiconductor layer 3, a plurality of gaps and pinholes 6 and 6' result unintentionally due to falling out of flakes which are incorporated into the semiconductor layer 3 during fabrication. There are observed about two to four such defects in ten fields of views through a microscope with a magnification of 100 to 1000.

According to the invention, the holes 6 and 6' are filled and stopped with an insulator. Hereinbelow, the stopping process will be explained in detail.

The semiconductor layer 3 with the holes 6 and 6' is coated with a photocurable organic resin by a spinner or a coater in such a manner that all the holes are filled completely with the resin 7 and 7'. The organic resin may be "Photoneeth" distributed from Toray Industries Inc., or other known photo resist. For instance, an amount of Photoneeth having a viscosity of about 120 CP is applied on the layer 3 in a 0.1 through 0.5 micrometers thickness by spinning at 500 rpm for 10 seconds and thereafter at 2000 rpm for 30 seconds, followed by a prebaking at 85° C. for an hour. The semiconductor layer 3 is irradiated from the glass substrate side with ultraviolet light 17 having 300 to 400 nanometers wavelength. The ultraviolet light cannot penetrate the semiconductor layer 3 because of the absorption in the layer whereas the resin stopping the holes 6 and 6' is selectively cured. In other words, the intensity and the wavelength are chosen so that the semiconductor layer 3 can function as a mask. Then, the uncured resin is elimated by a known rinsing. The remaining resin cured in the holes is chemically stabilized by sintering and post-curing. Thus the stopping process is completed.

After stopping the holes, grooves 18 are formed adjacent to the groove 13 as shown in FIG. 2(B) by means of laser scribing to provide an access to the first electrodes 37 and 37' via side contacts 8 and 9. Although the grooves 18 reach the substrate 1 in the figure, they can be more shallow as long as the first electrodes 37 and 37' are exposed by the grooves. Second electrodes 4 consisting of two conductive layers 23 and 24 are deposited on the laminated layers and separated by laser scribing into portions by grooves 20.

The lower conductive layer 23 may be 300 to 1400 angstroms thick and made from ITO, $In_2O_3$, $SnO_2$, or ITN (a mixture of indium nitride and tin nitride). The upper conductive layer 24 may be 300 to 500 angstroms thick and made, as a single or double layer, from aluminum, chromium or silver. For example, the second electrodes 4 may be composed of an aluminum layer 1000 angstroms thick on an ITO layer 1500 angstroms thick. The aluminum layers 24 form inside surfaces from which incident light 10 entering from the substrate side can be reflected. The ITO layers 23 are disposed to prevent the aluminum layer from corroding due to interaction with the semiconductor layer. These two layers are fabricated by an electron beam deposition or a plasma CVD method at less than 300° C. As a result, an improved solar cell is provided with which light having a wavelength of 600 to 800 nm can be efficiently converted into electricity.

For contact with an n-type semiconductor, a transparent indium compound or mixture including indium oxide and/or indium nitride is considered adequate as the transparent layer 23. For a p-type semiconductor, a tin compound or mixture of $SnO_2$, $Sn_3N_4$ and/or SbN is adequate in view of its high efficiency and long term reliability.

The transparent electrode 23 of cell 11 is formed in contact with the first electrode 2 of adjacent cell 31 at the groove 18. At this contact there is only a hetero- or homo-junction of a nitride and/or an oxide so that no interaction occurs even at 150° C., unlike the prior art illustrated in FIG. 1. In addition to this, such a laminated electrode 4 is advantageous especially for laser patterning. Namely, the aluminum electrode 24 can be removed during the laser patterning together with the transparent electrode 23 which is easily sublimated under irradiation of the laser beam and carries the aluminum electrode thereon away from the substrate.

A passivation film of silicon nitride 21 is then deposited to 500 to 2000 angstroms thickness by a photo CVD method or plasma vapor deposition; and an output terminal 5 is provided on the aluminum electrode 24. Thus, following placement of an organic resin encapsulating layer 22 comprising such as polyimide, polyamide, Kapton or epoxxy over the assemblage, the semiconductor device is made into a photoelectric conversion device in which a plurality of cells 31 and 11 are connected in series by the connection 12.

The organic resin layer 22 is provided mainly for fixation of the output electrode 5. Further, a device of 120×40 cm, two devices of 60 cm×40 cm, or six devices of 40 cm×20 cm are integrally packaged into a 120 cm×40 cm panel according to NEDO standard.

Experimental results obtained with a solar cell manufactured according to the above described process and having a substrate of 10 cm long×10 cm wide are given below:

| | |
|---|---|
| open-circuit voltage | 12.77 V |
| fill factor | 0.574 |
| short-circuit current | 69.0 mA |
| conversion efficiency | 7.46% |

Also, experimental results obtained with a solar cell which is manufactured without the stopping process, with other processing being similar to the above, are given below:

| | sample 1 | sample 2 |
|---|---|---|
| open-circuit voltage | 11.49 V | 3.02 V |
| fill factor | 0.471 | 0.316 |
| short-circuit current | 53.7 mA | 54.20 mA |
| conversion efficiency | 4.43% | 0.75% |

From the above data, it is seen that the hole stopping process makes the solar cells more efficient.

Figure 3:
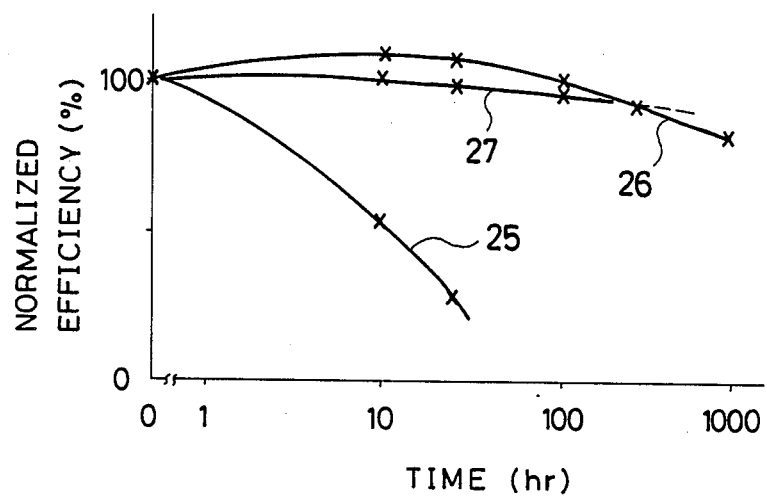
FIG. 3 is a graphical diagram showing the relation between heating time and photoelectric conversion efficiency.

FIG. 3 shows the variation of normalized efficiencies with the passage of time obtained by reliability trials of solar cells according to the prior art and the invention under atmospheric conditions but at 150° C. Curve 25 shows the normalized efficiency of the prior art device having the configuration of FIG. 1; the efficiency is degraded with time. In the prior art device, the aluminum electrode 4 is made in contact with the semiconductor layer 3 and in the contact 12 tin oxide layer 37 is in contact with the aluminum electrode 4. These contacts give rise to oxidation of the aluminum electrode 4 and to interaction between the electrode 4 and the semiconductor layer 3 of n-type. Because of this, the efficiency is degraded to less than 50% of the initial value after only ten hours.

On the other hand, curve 26 is plotted for the embodiment of the invention provided with resin stopping the holes and the two-layer laminated electrode 4. In this configuration only oxide-oxide contracts occur, making the contact 12 stable and reliable. The other important feature of the invention is not illustrated in the figure, namely that high yield can be obtained since the fluctuation of the characteristics among products is small. For instance, 0.27 was obtained as the variance of efficiency from ten samples 10 cm long×10 cm wide.

Referring to FIGS. 4(A) to 4(D), another embodiment of the invention is illustrated. On a substrate 1 such as a glass pane 1.2 mm thick×10 cm long×10 cm wide is formed of a conductive transparent film 2, e.g., a laminated film of an ITO layer 1500 angstroms thick on a $SnO_2$ layer 200 to 400 angstroms thick or a transparent film mainly composed of tin oxide or tin nitride doped with halogen. The film may be fabricated by an LPCVD method, a plasma CVD method, a spraying method, a sputtering method, or an ECR method.

The conductive film 2 is divided into a plurality of sections by patterned grooves 13 which are formed by a laser beam of 1.06 micrometers wavelength or 0.53 micrometers wavelength from a YAG laser controlled by a microcomputer.

The patterned grooves are 50 micrometers wide and 10 cm long by which each section of 10 to 20 mm width is partitioned from the others. On this film a nonmonocrystal semiconductor layer 3 of 0.2 to 1.0 micrometer thickness, more preferably 0.5 to 0.7 micrometer thickness, is formed with a p-n or p-i-n junction. A preferred example is a laminated layer composed of a p-type semiconductor layer ($Si_xC_{1-x}$; where $1>x>0$) 50 to 150 angstroms thick, an intrinsic amorphous or intrinsic semiamorphous silicon semiconductor layer 0.4 to 0.9 micrometer thick, and a crystalline layer 200 to 500 angstroms thick.

The semiconductor layer 3 with the holes 6 and 6' is coated by a spinner or coater with photocurable organic resin in such a manner that all the holes are completely filled with the resin. The organic resin may be a photoresist of positive type such as OFPR-800 distributed by Tokyo Ohka Kogyo Co., Ltd., or other known photoresist. For instance, an amount of photoresist 7 is applied on the layer 3 to a thickness of 0.1 through 5.0 micrometers by spinning at 500 rpm for 5 seconds and thereafter at 2000 rpm for an hour, followed by prebaking at 85° C. for 40 minutes. The semiconductor layer 3 is irradiated from the photoresist side with ultraviolet light 17 having 300 to 400 nanometers wavelength. The fixing of the OFPR-800 is effected by irradiation of ultraviolet light of 6 mW/cm² for 5 seconds, followed by aftertreatments. Then, the unfixed resin is eliminated by a known rinsing with pure water for 10 minutes. The remaining fixed resin in the holes 6 and 6' is chemically stabilized by sinter and post-cure treatments. For instance, the layer is given a post baking for an hour at 150° C. Thus the stopping process is completed.

Figure 4A:
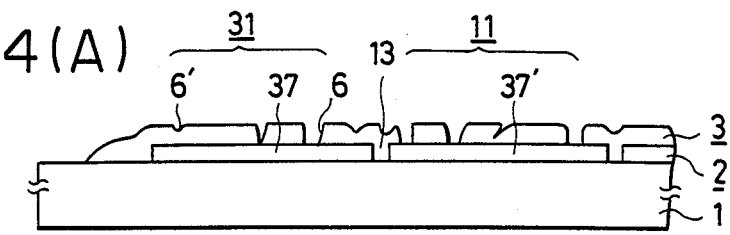
FIGS. 4(A) through 4(D) are fragmentary, cross-sectional views showing another embodiment of the invention.
Figure 4B:
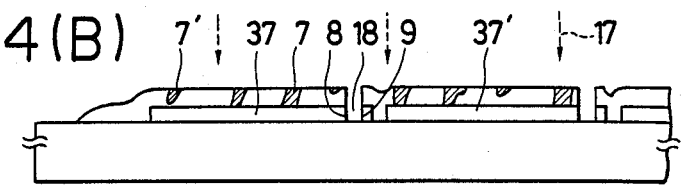
Figure 4C:
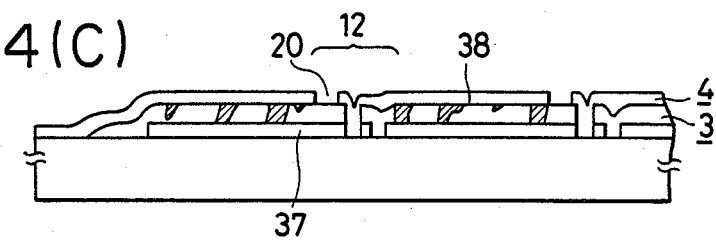

After stopping the holes, grooves 18 are formed adjacent to the grooves 13 as shown in FIG. 4(B) by means of laser scribing to provide an access to the first electrodes 37 and 37'. Although the grooves 18 reach the substrate 1 in the figure, they can be more shallow as long as the first electrodes 37 and 37' are exposed by the grooves 8. A second electrode 4 which may consist of two conductive layers is deposited on the laminated layers and separated into portions by grooves 20 formed by laser scribing.

The second electrode 4 may be a transparent conductive layer 300 to 500 angstroms thick, for example, made of ITO, $In_2O_3$, $SnO_2$ or ZnO through which incident light can go out of the device.

On the other hand, the second electrode may be formed reflective by deposition, on the transparent electrode, of aluminum, chromium, or silver as a single-layered reflective film, or aluminum and nickle as a double-layered reflective film. In this embodiment, the second electrode is comprised of an ITO layer 1050 angstroms thick and an aluminum layer 1000 angstroms thick. The electrode can be formed by sputtering, an electron beam deposition, or plasma CVD method at less than 300° C. in order not to degrade the semiconductor.

Figure 4D:
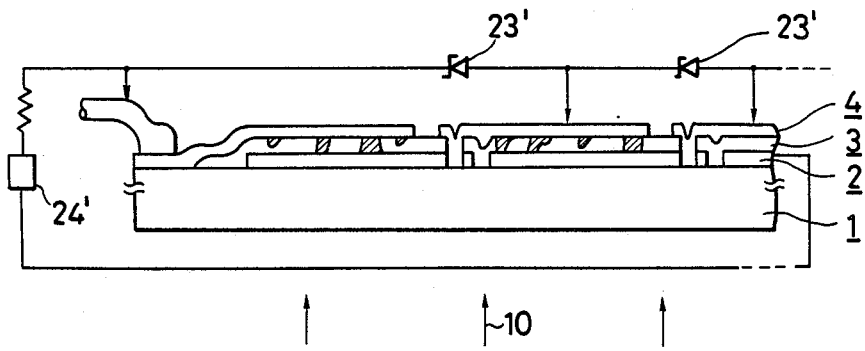
Figure 5:
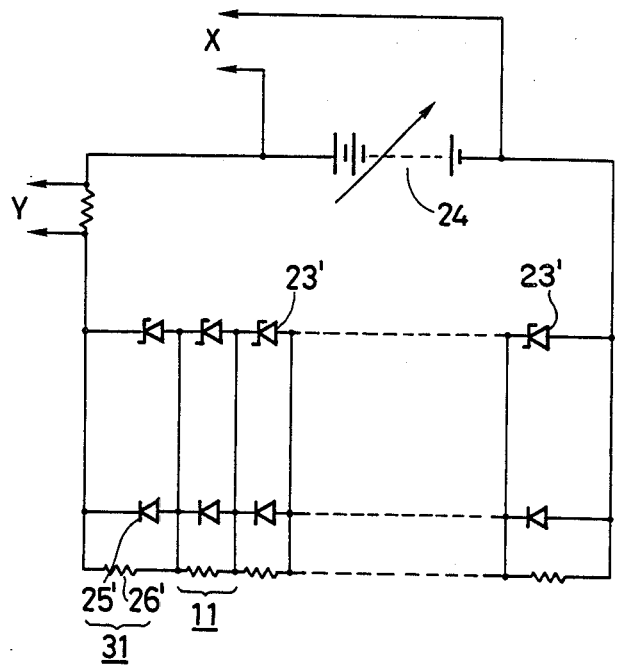
FIG. 5 is an equivalent circuit of another embodiment of the invention.

Referring to FIG. 4(D) and FIG. 5, a reverse bias applying circuit is illustrated. The circuit comprises a power supply 24' and a number of zener diodes 23'. Between each adjacent pair of diodes 23' and between the power supply and the first or last diodes contact is made with the first and second electrodes respectively so that the output voltage is divided into the reverse bias voltage which is applied to each cell constituting the device. The reverse bias voltage must be less than the breakdown voltage of the p-i-n junction of the semiconductor layer 3. Because of this the reverse bias voltage does not cause current to pass through flawless portions of the semiconductor layer 2. To preclude breakdown of the p-i-n junction further, the zener diodes are selected out of a variety of candidates for voltage dividing elements. The zener voltage is chosen slightly below the breakdown voltage of the p-i-n junction.

In FIG. 5, the circuit diagram includes the number of cells constituting the device, each of which is represented by a diode 25' corresponding to the semiconductor layer 2 and a resistance 26' corresponding to the defects (holes) as leakage source. The zener diode 23' is connected in parallel to the diode and the resistance so that the voltage applied to the diode 25' is kept below the breakdown voltage thereof.

With the bias voltage less than the breakdown voltage, the holes or flaws in the semiconductor layer 3 filled with the organic resin become current passages which are heated as electric current flows therethrough. The electric power is sometimes short of that required for completely burning out the holes or flaws. To make the burning out easy, the substrate 1 is heated in advance together with the semiconductor to a temperature less than that at which the semiconductor may be degraded, normally less than 150° C.

Figure 6:
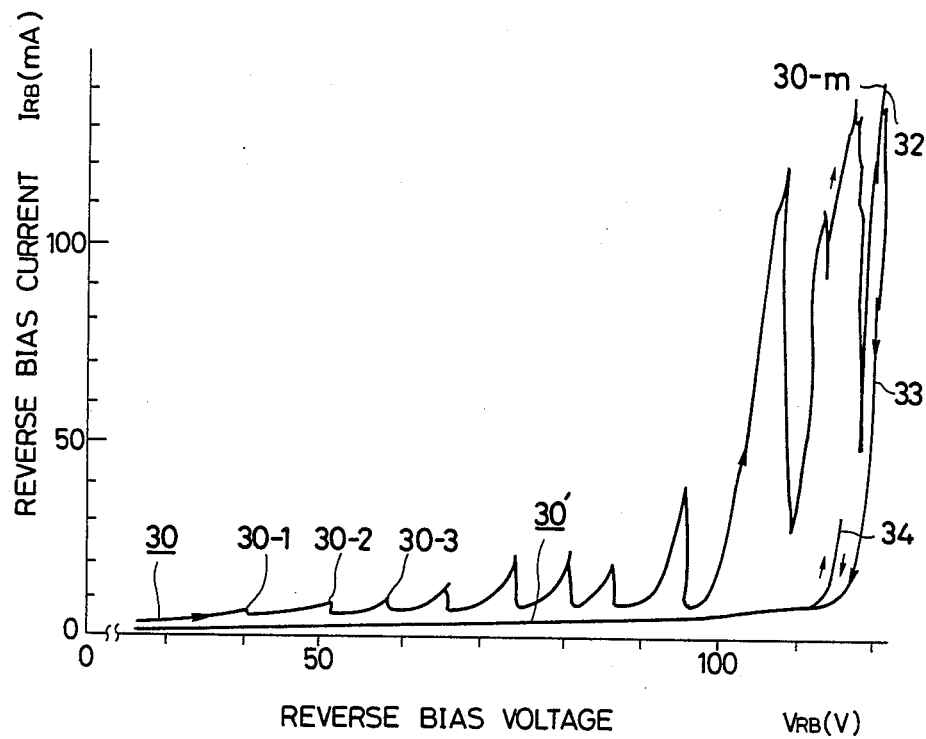
FIG. 6 is a graphical diagram showing the trend of reverse bias current in response to increasing reverse bias voltage.
Figure 7A:
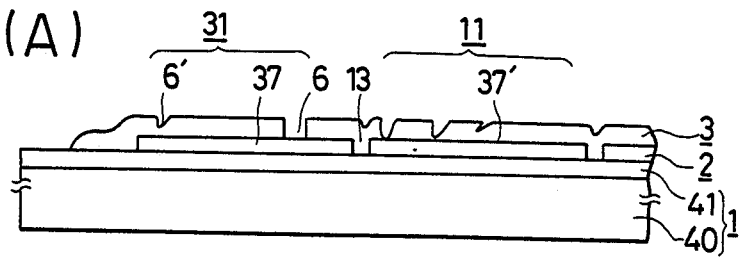
FIGS. 7(A) through 7(D) are fragmentary, cross-sectional views showing a further embodiment of the invention.
Figure 7B:
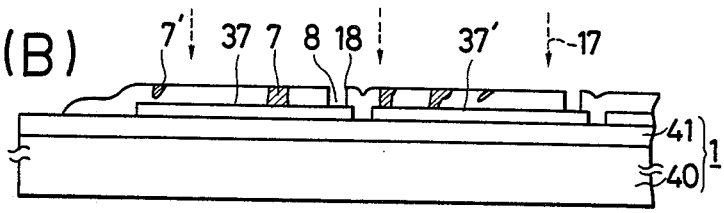
Figure 7C:
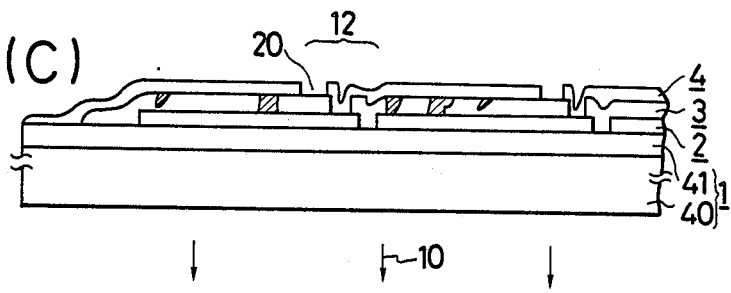
Figure 7D:
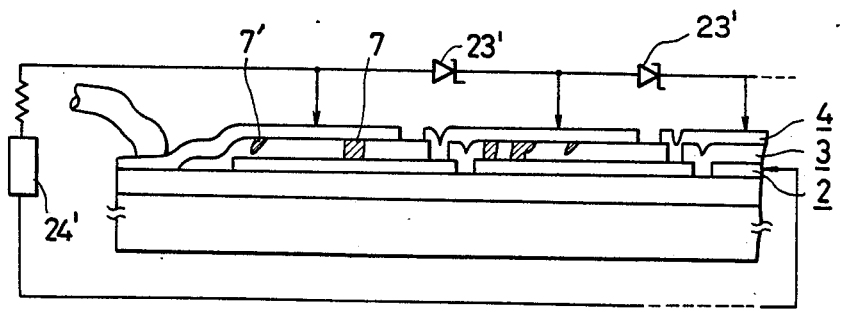

An experiment was made with a device having 15 cells connected with each other and the bias voltage set at 120 V. As a result, the current trend in response to increasing reverse bias voltage was obtained as shown in FIG. 6.

In the experiment, the reverse bias voltage increased from 0 V to 120 V. A first leakage current was observed at 30-1. However, the leakage current was cured because of burning out due to the concentrated current flow. As the reverse bias voltage increased, a number of current ripples were observed. The magnitude of the leakage current became larger at the higher reverse bias voltages. With the reverse bias voltage decreasing from a point 32, the reverse bias current smoothly dropped without leakage current.

For reference, the device thus treated was subjected to increasing reverse bias voltage. No leakage current, however, was observed until the reverse current increased at the breakdown voltage.

After removing the bias applying circuit, the device integrated on a 10 cm × 10 cm panel was irradiated with light of 100 mW/cm² (AM1). The characteristics obtained are:

| | |
|---|---|
| open-circuit voltage | 12.943 V |
| fill factor | 0.9941 |
| short-circuit current | 79.34 mA |
| current density | 17.290 mA/cm² |
| efficiency | 9.90% |

With the device fabricated according to the process identical to that shown in FIG. 4 but without reverse bias curing, the following experimental data 1 were obtained, and without the stopping process and reverse bias curing, the following experimental data 2 were obtained:

| | data 1 | data 2 |
|---|---|---|
| open-circuit voltage | 12.315 V | 11.49 V |
| fill factor | 0.597 | 0.471 |
| short-circuit current | 79.34 mA | 53.7 mA |
| efficiency | 8.33% | 4.43% |

Compared with the figures obtained with the initial embodiment, it is seen that the device having undergone the reverse bias voltage demonstrates further improvment in characteristics. The reason why the reverse bias curing is effective is considered that a chemical reaction between the resin and the semiconductor may produce a stable insulator tightly joined to the pin-holes.

A further embodiment of the invention is shown in FIG. 7. In this embodiment, the process is similar to that of the preceding embodiment. Thus only different configurations are described and a redundant explanation is is given.

A substrate 1 composed of a conductive stainless steel foil 40 of 10 to 100 micrometers thickness is coated with a heat resistant organic resin film or an inorganic insulator film such as of enamel 41. On the substrate 1, a first electrode 2 is formed, for example, made of a 200 angstroms thick chromium layer, a 200 to 400 Å thick tin oxide layer over a 1500 angstroms thick aluminum layer, a 500 angstroms thick $Sn_3N_4$ layer over a 1500 Å thick aluminum layer, or a 1500 to 2000 angstroms thick transparent conductive layer mainly composed of tin oxide or tin nitride doped with halogen.

On the substrate is formed a multilayered semiconductor with a pn junction or pin junction composed, for example, of an n-type semiconductor layer 200 to 500 angstroms thick, an intrinsic amorphous or semiamorphous silicon semiconductor layer 0.4 to 0.9 micrometers thick, and a p-type semiconductor layer ($Si_xC_{x-1}$ where $0<x<1$) 50 to 150 angstroms thick.

Then, after the stopping process is carried out, a second electrode 300 to 1400 angstroms thick is formed with the aid of a metallic mask. The second electrode 4 is made of a conductive transparent material such as ITO, $In_2O_3$, $SnO_2$ or ITN (a mixture of indium nitride and tin nitride).

Grooves 18 which provide accesses to the first electrode reach only to the surface of the first electrode 2, whereby the second electrode of cell 11 can be in contact with the first electrode 2 of cell 31.

After removing the bias applying circuit, the device integrated on a 10 cm × 10 cm panel was irradiated with light of 100 mW/cm² (AM1). The characteristics obtained were:

| | |
|---|---|
| open-circuit voltage | 12.618 V |
| fill factor | 0.672 |
| short-circuit current | 79.710 mA |
| current density | 17.371 mA/cm² |
| efficiency | 9.82% |

With the devices fabricated according to the process identical to that shown in FIG. 7 but without reverse bias curing, the following experimental data 1 were obtained, and without the hole stopping process and reverse bias curing, the following experimental data 2 were obtained:

| | data 1 | data 2 |
|---|---|---|
| open-circuit voltage | 11.30 V | 6.54 V |
| fill factor | 0.626 | 0.368 |
| short-circuit current | 79.4 mA | 75.69 mA |
| efficiency | 8.16% | 3.48% |

As in the above cases, only by stopping defects of the semiconductor layer is the performance of the photovoltaic device markedly improved, the efficiency versus time curve being plotted in FIG. 3 and indicated by reference numeral 27.

The other important feature of the invention is not illustrated in the figure, namely, that high yield can be obtained since the fluctuation of the characteristics is small among products. For instance, 0.195 (§9.63%) was obtained as a variance of efficiency from ten samples of 10 cm long × 10 cm wide prepared according to NEDO standard.

While the present invention has been described with reference to several preferred process and embodiments thereof, many variations and modifications will now occur to those skilled in the art. It is our intent, therefore, to be limited solely by the scope of the appending claims and not by the specific embodiments disclosed herein. Examples of the variation are as follows.

The semiconductor layer may be constituted by a multijunction structure in place of the single junction structure. Namely, the layer can be a laminate composed of a p-type semiconductor ($Si_xC_{1-x}$), an intrinsic amorphous silicon semiconductor, an n-type silicon semiconductor, a p-type semiconductor ($Si_xC_{1-x}$), an intrinsic semiconductor ($Si_xGe_{1-x}$), and an n-type silicon semiconductor layer 300 to 1000 angstroms thick, wherein $0<X<1$, e.g., $X=0.5$.

To form the grooves, all of the grooves can be formed at once by irradiating with a laser beam extending in the lateral direction which is produced from an eximer laser through a cylindrical lens, if necessary, after expansion of the original beam.

The above technique according to the invention is applicable also to a light emitting semiconductor device with double heterojunctions and a superlattice structure. As such devices, the applicant has disclosed some semiconductor devices in U.S. Pat. Nos. 4,527,179 and 4,616,244.

The invention is advantageous also when applied to a diode array of an image sensor or a nonlinear element of a thin film display. In some applications, the reverse bias voltage circuit can be dispensed with or very simplified. For example, an active device can be cured by applying a reverse voltage to source, drain and/or electrodes.

What is claimed is:

1. A method of manufacturing a semiconductor device comprising the steps of:

forming a first electrode on a substrate;

forming a continuous semiconductor layer on the first electrode, said layer undesirably having gaps formed therein;

coating the surface of said semiconductor layer with a positive photoresist to fill the gaps with said photoresist;

irradiating said photoresist from the photoresist side of said substrate to the extendt that at least a portion of said photoresist residing in said gaps becomes fixed;

removing the unfixed portion of said photoresist to thus plug the gaps with the fixed photoresist;

forming a second electrode on said semiconductor layer; and applying reverse voltage to the semiconductor layer subsequent to forming the second electrode.

2. A method of claim 1 wherein said applying step is carried out at a high temperature.

3. A method of claim 2 wherein said temperature is chosen not so high as to degrade the characteristics of the semiconductor layer.

4. A method of claim 1 wherein said reverse voltage is less than the breakdown voltage of the semiconductor layer.

5. A method of claim 4 wherein said semiconductor device comprises a plurality of solar cells connected to each other in series.

6. A method of claim 5 wherein said applying step is carried out with a voltage source and a plurality of zener diodes which are connected to each other in series, the reverse voltage applied to each cell being obtained from the corresponding diode.

* * * * *